(12) United States Patent
Abdallah et al.

(10) Patent No.: US 7,816,071 B2
(45) Date of Patent: Oct. 19, 2010

(54) PROCESS OF IMAGING A PHOTORESIST WITH MULTIPLE ANTIREFLECTIVE COATINGS

(75) Inventors: David J. Abdallah, Bernardsville, NJ (US); Mark O. Neisser, Whitehouse Station, NJ (US); Ralph R. Dammel, Flemington, NJ (US); Georg Pawlowski, Bridgewater, NJ (US); John Biafore, North Sciatuate, RI (US); Andrew R. Romano, Pittstown, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/338,462

(22) Filed: Jan. 24, 2006

(65) Prior Publication Data

US 2006/0177774 A1 Aug. 10, 2006

Related U.S. Application Data

(63) Continuation-in-part of application No. 11/054,723, filed on Feb. 10, 2005, now abandoned.

(51) Int. Cl.
*G03F 7/00* (2006.01)
(52) U.S. Cl. .................. 430/311; 430/330; 430/950
(58) Field of Classification Search ........................ None
See application file for complete search history.

(56) References Cited

U.S. PATENT DOCUMENTS

| | | | |
|---|---|---|---|
| 6,251,562 B1 | 6/2001 | Breyta et al. | |
| 6,303,260 B1 | 10/2001 | Hurditch et al. | |
| 6,346,361 B1 | 2/2002 | Shan et al. | |
| 6,844,131 B2 | 1/2005 | Oberlander et al. | |
| 2002/0039820 A1 | 4/2002 | Ireland et al. | |
| 2002/0097493 A1 | 7/2002 | Li et al. | |
| 2002/0182514 A1* | 12/2002 | Montgomery et al. | 430/5 |
| 2002/0195419 A1* | 12/2002 | Pavelchek | 216/16 |
| 2003/0129531 A1* | 7/2003 | Oberlander et al. | 430/271.1 |
| 2003/0216026 A1 | 11/2003 | Mukherjee-Roy et al. | |
| 2005/0064322 A1* | 3/2005 | Babich et al. | 430/270.1 |
| 2005/0145803 A1* | 7/2005 | Hakey et al. | 250/491.1 |
| 2005/0214674 A1 | 9/2005 | Sui et al. | |
| 2006/0275696 A1* | 12/2006 | Zampini et al. | 430/270.1 |

FOREIGN PATENT DOCUMENTS

| | | |
|---|---|---|
| EP | 1 016 930 A1 | 7/2000 |
| JP | 2007-49026 A | 2/2007 |
| WO | WO 2004/113417 | 12/2004 |

OTHER PUBLICATIONS

N. Matsuzawa et al., "Numerial Investigations on Requirements for BARC Materials for Hyper NA Immersion Lithography", Journal of Photopolymer Science and Technology vol. 18, No. 5, pp. 587-pp. 592 (2005).
Kawata et al., "Optical Projection Lithography Using Lenses with Numerial Apertures Greater Than Unity", Microelectronic Enginering vol. 9, No. 1-4, pp. 31-pp. 36 (1989), XP000034346.
Linliu et al., "A Novel Dual Layer Polymeric Anti-Reflective Coating (PARC) for Sub-0.18 μm KrF Lithography", SPIE vol. 4000, pp. 982-pp. 993 (2000), XP02394894.
Meador et al., "New Materials for 193-nm Trilayer Imaging", SPIE vol. 5376, No. 1, pp. 1138-pp. 1148 (2004), XP002394895.
Mukherjee-Roy et al., "A dual BARC method for Lithography and Etch for Dual Damascene with Low K", Japanese Journal of Applied Physics vol. 42, No. 5A, Part 1, pp. 2649-pp. 2653 (2003), XP001192254.
H. L. Chen et al., "Novel bilayer bottom antireflective coating structure for high-performance ArF lithography applications", J. Microlith., Microfab., Microsyst., vol. 1 No. 1, pp. 58-pp. 62 (2002).
Robert J. Fox, III, "Dual-layer Hybrid (Organic/Inorganic) Anti-Reflective Coating", Motorola (2002).
C. H. Lin et al., "Optimized bilayer hexamethyldisiloxane film as bottom antireflective coating for both KrK and Arf lithographies", J. Vac. Sci. Technol. B, vol. 18 No. 6, pp. 3323-pp. 3327 (Nov./Dec. 2000).
Qun Yin Lin et al., "Dual Layer Inorganic SiON Bottom ARC for 0.25 μm DUV Hard Mask Applications", SPIE vol. 3678, pp. 186-pp. 197 (Mar. 1999).
Chris A. Mack, "The Lithography Expert: Designing a bottom antireflection coating", Solid State Technology, Microlithography World, vol. 14 No. 1, pp. 12-pp. 14 (Feb. 2005).

(Continued)

*Primary Examiner*—Daborah Chacko Davis
(74) *Attorney, Agent, or Firm*—Sangya Jain

(57) ABSTRACT

A process for imaging a photoresist comprising the steps of, a) forming a stack of multiple layers of organic antireflective coatings on a substrate; b) forming a coating of a photoresist over the upper layer of the stack of multiple layers of organic antireflective coatings; c) imagewise exposing the photoresist with an exposure equipment; and, d) developing the coating with a developer.

22 Claims, 2 Drawing Sheets

OTHER PUBLICATIONS

Notification Concerning Transmittal of International Preliminary Report on Patentability (Chapter 1 of the Patent Cooperation Treaty) (Form PCT/IB/326), the International Preliminary Report on Patentability (Form PCT/IB/373), and the Written Opinion of the International Searching Authority (Form PCt/ISA/237) for PCT/IB2006/00000409.

Invitation to Written Opinion from the Austrian Patent Office under letter dated Jan. 22, 2009 from the Intellectual Property Office of Singapore for related Singapore Patent Application No. 2007 05658-3—6 Pages.

The Notification of Transmittal of the International Search Report and the Written Opinion of the International Searching Authority, or the Declaration (Form PCT/ISA/220), of the International Search Report (Form PCT/ISA/210) and of theWritten Opinion of the International Searching Authority or PCT/IB2006/000409, Nov. 2006.

Dammel et al., "193 nm Immersion Lithography—Taking the Plunge", Journal of Photopolymer Science and Technology vol. 17, No. 4, pp. 587-pp. 602 (2004), XP008051455.

English Language Abstract of JP 2007-49026 A, Feb. 22, 2007.

H. L. Chen et al., "Multi-layer Bottom Antireflective Coating Structures for High NA ArF System Applications", SPIE vol. 4690, pp. 1085-pp. 1092 (Apr. 2002).

English Translation of Office Action from Chinese Patent Application No. CN 200680008827.0 dated Jul. 8,2010.

* cited by examiner

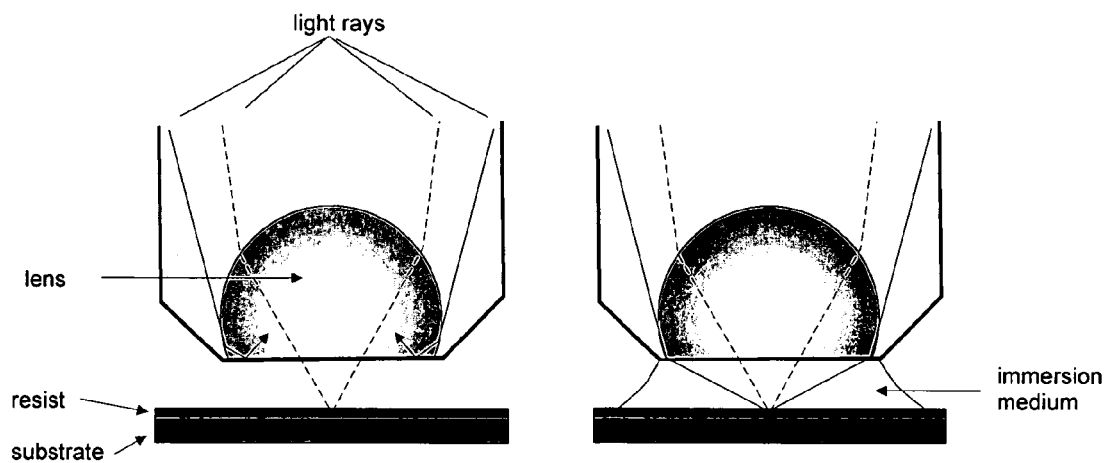
Figure 1: Optical path of light rays for air and an immersion medium.
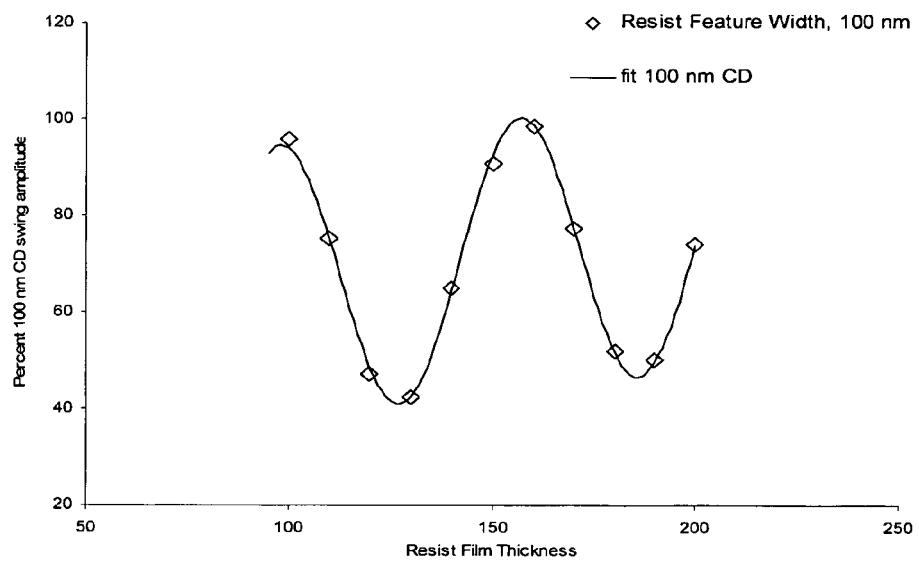
Figure 2: 100 nm 1:1 line CD vs. photoresist thickness

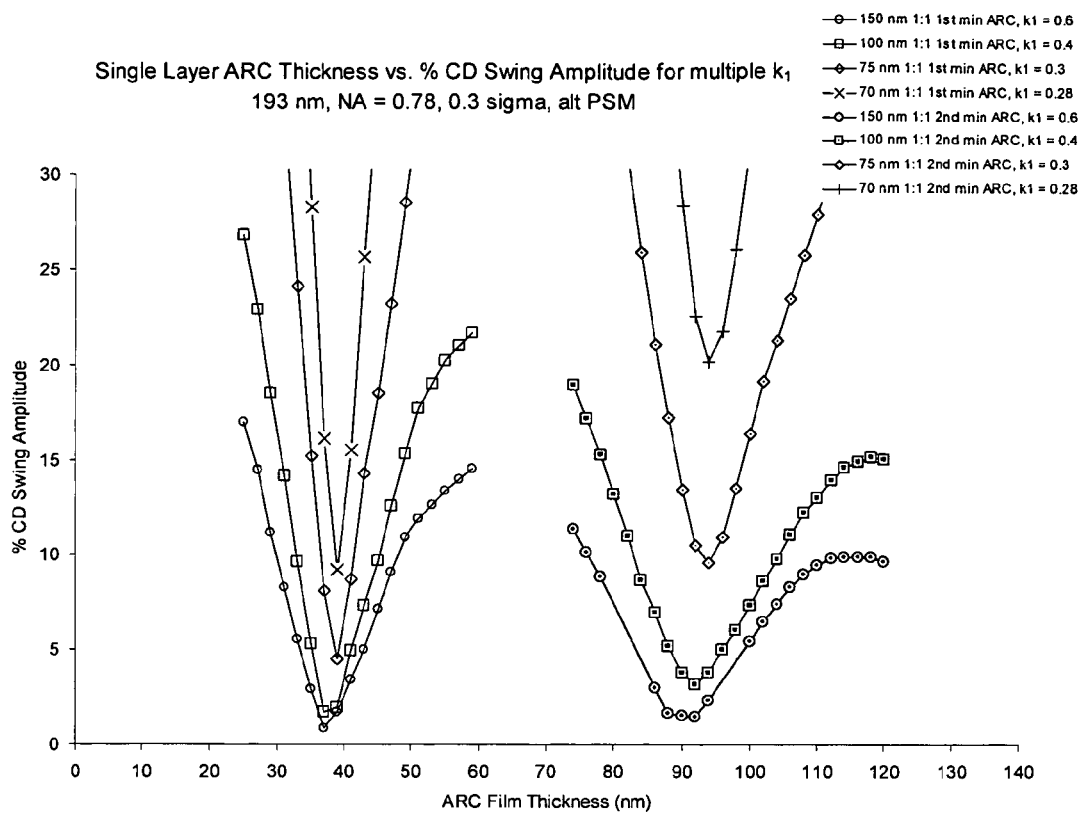
Figure 3: CD swing for single layer BARC
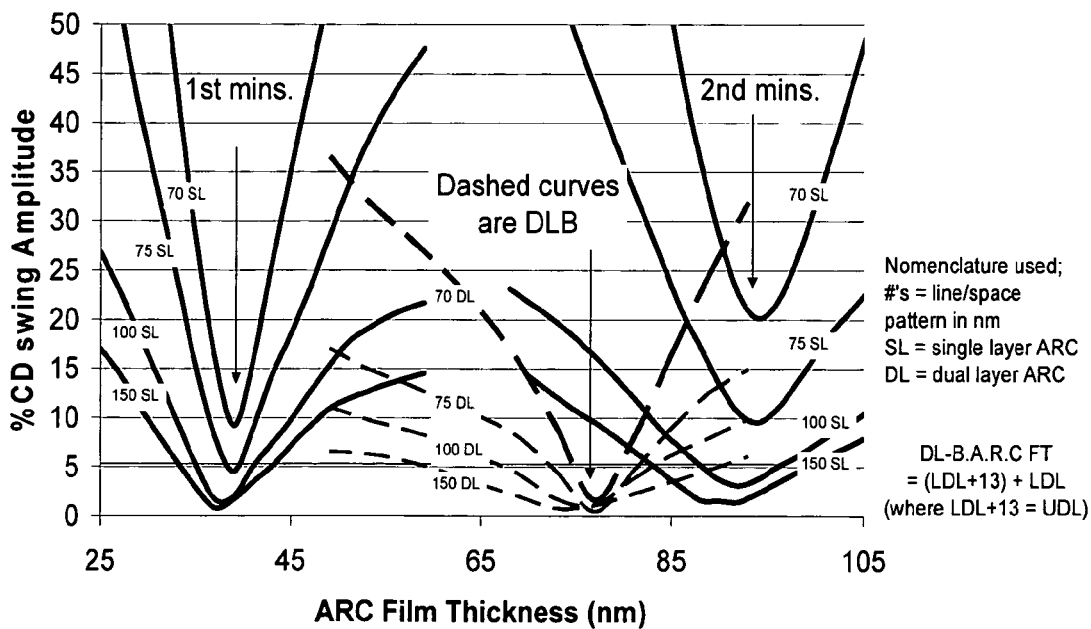
Figure 4: CD swing amplitude for single layer and dual layer BARCs

PROCESS OF IMAGING A PHOTORESIST WITH MULTIPLE ANTIREFLECTIVE COATINGS

CROSS-REFERENCE TO RELATED APPLICATION

This application is a continuation-in-part of U.S. patent application Ser. No. 11/054,723 filed Feb. 10, 2005, now abandoned, the contents of which are hereby incorporated herein by reference.

FIELD OF INVENTION

The present invention relates to a process for imaging a photoresist, where the photoresist is coated over multiple layers of organic antireflective coatings. The process is especially useful for imaging photoresists using radiation in the deep ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed (positive photoresist) or the unexposed areas of the photoresist (negative photoresist).

Positive working photoresists when they are exposed image-wise to radiation have those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Again, a desired portion of the underlying surface is uncovered.

Negative working photoresists when they are exposed image-wise to radiation, have those areas of the photoresist composition exposed to the radiation become insoluble to the developer solution while those areas not exposed remain relatively soluble to the developer solution. Thus, treatment of a non-exposed negative-working photoresist with the developer causes removal of the unexposed areas of the coating and the formation of a negative image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many leading edge manufacturing applications today, photoresist resolution on the order of less than 100 nm is necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

The trend towards the miniaturization of semiconductor devices has led to the use of new photoresists that are sensitive at lower and lower wavelengths of radiation and has also led to the use of sophisticated multilevel systems, such as antireflective coatings, to overcome difficulties associated with such miniaturization.

Photoresists sensitive to short wavelengths, between about 100 nm and about 300 nm, are often used where subhalfmicron geometries are required. Particularly preferred are deep uv photoresists sensitive at below 200 nm, e.g. 193 nm and 157 nm, comprising non-aromatic polymers, a photoacid generator, optionally a dissolution inhibitor, and solvent.

High resolution, chemically amplified, deep ultraviolet (100-300 nm) positive and negative tone photoresists are available for patterning images with less than quarter micron geometries.

Another recent way to improve the resolution and depth of focus of photoresists, has been to use immersion lithography to extend the resolution limits of deep uv lithography imaging. In the traditional process of dry lithography imaging, air or some other low refractive index gas, lies between the lens and the wafer plane. This abrupt change in refractive index causes rays at the edge of the lens to undergo total internal reflection and not propagate to the wafer (FIG. 1). In immersion lithography a fluid is present between the objective lens and the wafer to enable higher orders of light to participate in image formation at the wafer plane. In this manner the effective numerical aperture of the optical lens (NA) can be increased to greater than 1, where $NA_{wet} = n_i \sin \theta$, where $NA_{wet}$ is the numerical aperture with immersion lithography, $n_i$ is refractive index of liquid of immersion and $\sin \theta$ is the angular aperture of the lens. Increasing the refractive index of the medium between the lens and the photoresist allows for greater resolution power and depth of focus. This in turn gives rise to greater process latitudes in the manufacturing of IC devices. The process of immersion lithography is described in 'Immersion liquids for lithography in deep ultraviolet' Switkes et al. Vol. 5040, pages 690-699, Proceedings of SPIE, and incorporated herein by reference.

For 193 nm and 248 nm and higher wavelengths immersion lithography, water is of sufficient inherent transparency so that it can be used as the immersion fluid. Alternatively, if a higher NA is desired, water's refractive index can be increased by doping with UV transparent solutes. However, for 157 nm lithography, water's high absorbance makes it unsuitable as an immersion fluid. Currently certain oligomeric fluorinated ether solvents have been used as suitable immersion fluids.

Bottom antireflective coatings are also used to prevent reflection from the various substrates used in IC processing for both dry and immersion lithography. The use of high NA lenses (typically NA greater than 1), especially in immersion lithography, with a wide range of angles of incidence, together with very diverse topographical features on substrates has reduced the effectiveness of single layer antireflective coatings. Multiple layers of bottom antireflective coatings (BARCs) with varying values of refractive index (n) and, especially, absorption (k), for each layer, provide a solution to the difficulties of dry or immersion lithography. Inorganic bottom antireflective coatings allow a gradual change in n and k values through the chemical vapor deposition (CVD) of inorganic materials, as discussed by Chen et al, in Proceedings of SPIE Vol. 4690, pg. 1085-1092, 2002. However, the process complexity of incorporating into the manufacturing process of the device another step requiring a chemical vapor deposition tool is not preferred. Similarly, combinations of organic BARCs and inorganic BARCs are not preferred, since an additional CVD tool is still required. Multiple layers of organic BARCs are more desirable since these layers are formed through a cheaper spin coating process. In most cases with smaller and more complex devices, BARCs which can form planarizing coatings are preferred. Inorganic coatings are conformal, whereas organic BARCs are capable of forming planarizing coatings, thus organic BARCs are preferred. Multiple layers of organic BARCs can provide the gradient in n and k values, but too many layers can add to the complexity of the imaging process. However a minimal number of layers, especially a two layer organic BARC stack, could provide an acceptable compromise. Thus there is a need for a simple multiple stack of organic BARCs which can effectively reduce reflection from the substrate during the imaging process of a photoresist.

The inventors of the present application have found that a process for lithography, especially immersion lithography, which comprises coating a substrate with at least two distinct organic antireflective coatings under a deep uv photoresist, where each antireflective coating having a different set of optical properties, provides unexpectedly good lithographic results.

SUMMARY OF THE INVENTION

The present invention relates to a process for imaging a photoresist comprising the steps of, a) forming a stack of multiple layers of organic antireflective coatings on a substrate; b) forming a coating of a photoresist over the upper layer of stack of multiple layers of organic antireflective coatings; c) imagewise exposing the photoresist with an exposure equipment; and, d) developing the photoresist coating. Preferably the exposure equipment comprises a lens with numerical aperture of greater than one, especially where the exposure equipment uses immersion lithography. The process is particularly suited for stack of multiple layers of antireflective coatings comprising two layers, a lower layer and an upper layer.

BRIEF DESCRIPTION OF THE DRAWINGS

FIG. 1 describes the path of the light in dry and immersion lithography.

FIG. 2 shows the variation of the critical dimension (CD) with changes in photoresist thickness for a 100 nm 1:1 line.

FIG. 3 shows the variation of the critical dimension (CD) swing curve for single layer BARC.

FIG. 4 shows the CD swing amplitude for single layer and dual layer BARCs.

DETAILED DESCRIPTION OF THE INVENTION

The present invention relates to the process for imaging a photoresist using dry or immersion lithography, where a stack of multiple layers of organic antireflective coatings are coated on a substrate with a photoresist coating on top of the antireflective coatings. The photoresist coating is then imagewise exposed. The process is particularly suited for imaging using lithography, especially where the numerical aperture of the lens in the exposure system is greater than one, and more especially for immersion lithography. The process is also suitable for imaging on transparent or partially transparent layers that form part of the substrates. A two layer antireflective coating stack is preferred from a process simplicity point of view, although more layers may also be used based on other lithographic advantages.

In a simple two layer antireflective coating stack, the lower layer antireflective coating (ARC) is formed on a reflective substrate, and over this lower ARC layer an upper layer antireflective coating is formed. The lower layer ARC is more absorbing than the upper layer ARC. Thus, in a multiple stack of ARCs the lower layers are more absorbing than the top layers, thus setting up a gradient of decreasing absorption from the substrate to the photoresist layer. The multiple stack of ARCs reduce the total reflectivity from the substrate to values near 2%, preferable less than 1% by a combination of absorption of exposure radiation in the lower layer and interference effects in the upper layer. Overall absorption can range from 25% to 90% of the light that has penetrated the resist/upper layer ARC interface and the remaining radiation is reduced by destructive interference. A layer of photoresist is then coated over the uppermost layer of antireflective coating. The coatings are then imagewise exposed to radiation in an exposure unit. Immersion lithography, where a suitable immersion liquid is present between the exposure equipment and the coatings, is preferred. After exposure the coatings are baked and developed using an aqueous alkaline developer.

In a multilayer ARC system for one embodiment the absorption of each layer is increased with the highest absorbing layer closest to the substrate and the lowest absorbing layer closest to the photoresist. In a dual layer ARC the lower layer is more highly absorbing than the upper layer. Through computer modeling, as exemplified below, it has been found that for a dual stack system, the absorption of the lower layer ARC ranges from about 0.3 to about 1.2, and the absorption of the upper layer ranges from about 0.05 to about 0.4. Since it is desirable to minimize the thickness of the BARC layers, coatings with high refractive indices (n) are preferable, since the compressed wavelength effectively reduces the thickness necessary to establish the correct phase change. With respect to reflectivity the demands on the refractive index of the lower ARC layer is not as stringent but should be as close to the value of the upper layer to reduce reflections from the upper/lower layer interface. The refractive index for both the ARC layers can range from about 1.5 to about 2.2. Reflectivity is suppressed through a wider range of angles if the topmost ARC layer has a refractive index which is equal to or higher than the refractive index of the photoresist layer. Typically, for most commercial photoresists the refractive index ranges from about 1.65 to about 1.75. Photoresist thickness is carefully chosen to avoid pattern collapse near the maximum thickness and yet maintain a suitable thickness for etch masking near the minimum thickness. Typically the photoresist thickness usually does not exceed 3 times the smallest photoresist feature width. However, mechanically robust resist can exceed this value. Lower photoresist thicknesses can be acceptable depending on the type of processing required for the photoresist. Thus, photoresist thickness can typically range from 15 nm to 300 nm. The exact ARC thickness may also be determined by computer simulations. A first approximation for the photoresist film thickness can be determined to be equivalent to twice the distance of a ¼ multiple of the compressed wavelength ($\lambda/n$), increased by $1/\cos\theta$ ($\theta$ is the angle of light in BARC). Film thickness for the BARC layers should be optimized through simulations, and usually range from 15 nm to 100 nm.

Any type of antireflective coating may be used for the present invention. Most often, the antireflective coating solutions used to form the BARC layers of the present invention comprise a curable polymer. Typically the antireflective coating comprises a polymer, a crosslinking agent, an acid generator and a solvent. The absorbing chromophore may be present in the polymer or as a dye additive. The polymer is capable of crosslinking with the crosslinking agent, preferably in the presence of an acid. The acid may be generated thermally or photolytically. The polymer comprises a moiety containing a crosslinking site and a moiety containing a chromophore which absorbs at the exposure wavelength. The polymer may contain other functionalities which provide the necessary solubility characteristics and other properties for good lithographic performance. In order to meet the physical parameters required for the ARC layers, the polymer of the different layers are designed differently. The lower layers require higher absorption characteristics than those above them, and thus must have more units which have functionalities that absorb radiation of the exposure wavelength or functionalities with higher extinction coefficient. As an example, 248 nm ARC polymers may contain anthracene functionalities, and 193 nm and 157 nm ARC polymers may contain aromatics with one ring, carbonyls and imides. The absorbing units may also provide a crosslinking site. The ARC polymers may be synthesized typically by condensation or free radical polymerization, though any type of polymerization may be used. Typical condensation polymers are exemplified, without limitation, by a) polyamides which are formed by reacting diamines with dicarboxylic acids, diamines with acid chlorides of a dicarboxylic acids; b) polyesters which are formed by reacting dialcohols with dicarboxylic acids, dialcohols with diesters; and c) polyurathanes which are formed by reacting dialcohols with diisocyanates. Typical examples of absorbing monomers for condensation polymerization are 1,4-benzenedimethanol, terephthalic acid, dimethyl terephthalate, alpha,alpha,alpha',alpha'-tetramethyl-1,4-benzenedimethanol, 4-(aminomethyl)benzylamine terephthalamide: the proceeding examples are all 1,4 substituted which need not be the case and any substitution pattern will work.

Typical polymers for free radical polymerization are exemplified, without limitation, by the polymerization of monomers containing at least one double bond, which include, alkenes, vinyl aromatics, alkyl alkyl acryate and halogenated analogs of each example of the previous examples. Typical absorbing monomers for free radical polymerization are exemplified, without limitation, by monomers containing at least one double bond, such as such as methyl (2Z)-3-phenyl-2-butenoate, vinyl cinnamate, benzyl methacrylate and styrene.

The ARC polymers may contain other comonomers which are nonabsorbing or weakly absorbing. These monomers may provide other properties, such as crosslinking sites, functionalities that modify the solubility of the polymer in various solvents used to formulate the ARC, monomers to modify the absorption of the polymer to the desired range, monomers that adjust the dry etch rate to the desired values. Typically the etch rate of the ARC layers is the same or higher than the etch rate of the photoresist coated over the ARCs. Aromatic functionalities have a slower etch rate than alicyclic functionalites, which are slower than linear or branched aliphatic functionalities. Such comonomers are exemplified, without limitation, by methyl acrylate, methyl methacrylate, methyl vinyl ether, hydroxyethyl methylacrylate, and 2-hydroxypropyl methylacrylate.

Some useful polymers for antireflective coatings and useful monomers to make the polymers of the present invention are disclosed in the following patents and patent application, U.S. Pat. Nos. 5,994,430, 6,187,506, 6,114,085 and 2004/0101779, and incorporated herein by reference.

The exact proportion of the various monomers incorporated into the polymer is predicated on the exact lithographic properties required. The polymer, once formed, may also be further reacted with compounds to give the final polymer.

The weight average molecular weight of the polymer may range from about 1500 to about 180,000, preferably from about 4,000 to about 60,000 and more preferably from about 10,000 to about 30,000. When the weight average molecular weight is below 1,500, then good film forming properties are not obtained for the antireflective coating and when the weight average molecular weight is too high, then properties such as solubility, storage stability and the like may be compromised.

Since spin coating of a stack of multiple ARCs can lead to nonuniform intermixing between the layers, it is desirable to have very little or no intermixing between the ARC layers.

Typically the antireflective coating composition comprises a polymer, a crosslinking agent, an acid or/and an acid generator, and a solvent.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol are preferred.

Other types of polymers (which also refers to oligomers) which contain functionalities that enhance dry etch resistance may be used, such as polymers having incorporated into them silicon, germanium or boron. These functionalities, especially silicon, may be part of the polymer backbone or be pendant from the polymer backbone and these polymers may further incorporate into them absorbing organic chromophores as described previously. Such antireflective coatings comprising, for example, organo-silicon materials, such as those described in WO 2004/113417, are desirable for their dry etch resistance and for their ability to form coatings that are spin coatable. Siloxane-type of polymers with attached chromophores can be used; examples of chromophores are phenyls, anthracenyls and naphthyls. The polymers may be crosslinked by heating the antireflective coating alone and may not require a crosslinking agent, although a crosslinking agent may be used. The polymers may be used dissolved in a solvent and optionally contain other additives. Examples of additives are thermal acid generator, photoacid generator, plasticizers, etc.

The (thermal or photo) acid generator of the present invention, preferably a thermal acid generator, is a compound which, when heated to temperatures greater than 90° C. and less than 250° C., generates an acid. The acid crosslinks the polymer. The antireflective film after heat treatment becomes insoluble in the solvents used for coating photoresists, and furthermore, is also insoluble in the alkaline developer used to image the photoresist. Preferably, the thermal acid generator is activated at 90° C. and more preferably at above 120° C., and even more preferably at above 150° C. The antireflective film is heated for a sufficient length of time to crosslink the coating. Examples of thermal acid generators are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid.

Thermal acid generators are preferred over free acids, although free acids may also be used, in the novel antireflective composition, since it is possible that over time the shelf stability of the antireflective solution will be effected by the presence of the acid, if the polymer were to crosslink in solution. Thermal acid generators are only activated when the antireflective film is heated on the substrate. Additionally, mixtures of thermal acids and free acids may be used. Although thermal acid generators are preferred for crosslinking the polymer efficiently, an antireflective coating composition comprising the polymer and crosslinking agent may also be used, where heating crosslinks the polymer. Examples of a free acid are, without limitation, strong acids, such as sulfonic acids. Sulfonic acids such as toluene sulfonic acid, triflic acid or mixtures of these are preferred.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodnium salts, triphenyl sulfonium salts, dialkyl iodonium salts, triakylsulfonium salts, and mixtures thereof.

The amount of the polymer in the ARC composition can vary from about 95 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the acid or acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the polymer, crosslinker and the acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 20 weight %, and even more preferably below 10 weight %.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The substrates over which the antireflective coatings are formed can be any of those typically used in the semiconductor industry. Suitable substrates include, without limitation, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

The lower layer antireflective coating composition is coated on the substrate using techniques well known to those skilled in the art, such as dipping, spin coating or spraying. The film thickness of the antireflective coating ranges from about 15 nm to about 200 nm. The optimum film thickness is determined by the type of the stack of ARC coatings. The coating is further heated on a hot plate or convection oven for a sufficient length of time to remove any residual solvent and induce crosslinking, and thus insolubilizing the antireflective coating to prevent intermixing between the antireflective coatings. The preferred range of temperature is from about 90° C. to about 250° C. If the temperature is below 90° C. then insufficient loss of solvent or insufficient amount of crosslinking takes place, and at temperatures above 250° C. the composition may become chemically unstable. Likewise, the second layer of the antireflective coating is coated over the lower layer and baked. Multiple layers of antireflective coatings are coated. A film of photoresist is then coated on top of the uppermost antireflective coating and baked to substantially remove the photoresist solvent. An edge bead remover may be applied after the coating steps to clean the edges of the substrate using processes well known in the art.

Photoresists can be any of the types used in the semiconductor industry, provided the photoactive compound in the photoresist and the antireflective coating absorb at the exposure wavelength used for the imaging process.

To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and GB 2320718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (Hoang V. Tran et al Macromolecules 35, 6539, 2002, WO 00/67072, and WO 00/17712) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; WO 02/065212) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

After the coating process, the photoresist is imagewise exposed. The exposure may be done using typical dry exposure or may be done using immersion lithography. Multiple layers of antireflective coatings are particularly advantageous for imaging with immersion lithography where the lens has high numerical aperture (NA), especially where the NA is greater than 1.

The exposed photoresist is then developed in an aqueous developer to remove the treated photoresist. The developer is preferably an aqueous alkaline solution comprising, for example, tetramethyl ammonium hydroxide. An optional heating step can be incorporated into the process prior to development and after exposure.

The process of coating and imaging photoresists is well known to those skilled in the art and is optimized for the specific type of resist used. The image transfer through to the substrate from the imaged photoresist and through the antireflective coatings is carried out by dry etching in a similar manner used for etching through a single layer organic antireflective coating. The patterned substrate can then be dry etched with an etching gas or mixture of gases, in a suitable etch chamber to remove the exposed portions of the antireflective film, with the remaining photoresist acting as an etch mask. Various gases are known in the art for etching organic antireflective coatings, such as $O_2$, $Cl_2$, $F_2$ and $CF_4$.

In one embodiment any of the top antireflective coatings may be an organic coating which when exposed can be developed with the same aqueous alkaline developer as the photoresist and in the same step. Such developer soluble antireflective coatings are known in the art and examples of which are in the following references which are incorporated by reference: U.S. Pat. No. 6,844,131 and US 2005/0214674.

In the processing of semiconductors and other substrates antireflective coatings are used to suppress reflections in photoresist. Bottom antireflective coatings are coated on top of a substrate and underneath a photoresist film. Antireflective coatings help suppress reflection effects like standing waves in the photoresist, reflective notching and exposure dose changes due to natural fluctuations in the thickness of the photoresist and substrates. If the photoresist and antireflective coatings are coated over a substrate that contains a layer that is not totally opaque to the actinic light, then changes in the thickness of transparent or partially transparent layer(s) in the substrate underneath the photoresist can cause the photoresist to see a different effective exposure dose for different thicknesses of that layer, resulting in unwanted changes in the critical dimensions (CD) in the exposed and developed photoresist pattern. Examples of materials that could make up such a transparent or partially transparent layer are 1) silicon nitride, which is transparent at 248 nm and 365 nm and partially transparent at 193 nm, 2) silicon dioxide, which is transparent at 157, 193 nm, 248 nm and 365 nm, and 3) porous variants of oxide, which can be used as low k dielectrics and have partial or full transparency at these wavelengths. For a transparent layer, it takes one quarter the wavelength of the actinic light in that material to go from destructive interference to constructive interference. Therefore, as an example for silicon dioxide transparent layer on a substrate, using 193 nm exposure wavelength, this thickness change is about 31 nm (193 nm/(1.56×4), where 1.56 is the refractive index of silicon dioxide at 193 nm). Given that in many cases silicon dioxide can be many hundreds of nanometers thick, and that thickness tolerances including cross wafer, wafer to wafer and lot to lot variation are often +/−10% or more, it is clear that oxide thickness can make a significant contribution to the reflected component of light in the photoresist, known as "oxide swing".

In order to avoid the effect of oxide swing the applicants have found that a multilayer antireflective coating works much better than a single layer antireflective coating. If a single layer antireflective coating is used on top of a transparent layer on a substrate, then a high absorbance, typically a k value of 0.5 or greater will have to be used to suppress the swing due to variations in the thickness of the transparent layer. However, photoresists have to be transparent, with k values less than 0.05 to function well, which makes the difference between the refractive indices of the antireflective coating and the photoresist large enough that there is substantial residual reflection from the surface of the antireflective coating into the photoresist, leading to a significant CD swing curve for changes in photoresist thickness. However, if a dual layer antireflective coating is used, where the underlayer has a high absorbance, and the top layer has a lower k value, then the effect on CD of the oxide swing and the photoresist swing can be minimized simultaneously. Thus in one embodiment the multilayer antireflective coatings are formed on a transparent or partially transparent substrate layer, where the substrate may comprise various compositionally different layers.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Example 1

Computer simulation studies were carried out in Prolith v8.1 (available from Finle Corp. Austin, Tex.) to investigate the comparative performance of three organic antireflective systems: two single-layer BARCs designed for $1^{st}$ and $2^{nd}$ minimum film thickness application, and the dual layer BARC system.

The response evaluated was substrate reflectivity, Sr, and the % resist critical dimension (CD) swing amplitude evaluated for a range of $k_1$ values ranging from 0.6 to 0.28 at 193 nm. The inputs for all BARCs were film thickness. The optical constants for each BARC were fixed; the film thickness (FT) ranges evaluated were for:

Single Layer BARC:

For $1^{st}$ min SLR: AZ® 1C5D, FT 20 nm to 80 nm, n=1.6–0.51i at 193 nm

For $2^{nd}$ min SLR: AZ® ArF38, FT 50 nm to 120 nm, n=1.7–0.34 i at 193 nm

Dual layer: Upper Layer BARC, FT 13 nm to 77 nm, n=1.702–0.196i at 193 nm; Lower Layer BARC, 0 nm to 64 nm, n=1.904–0.67i at 193 nm The AZ® solutions are available from AZ® Electronic Materials USA Corp., Somerville, N.J.

The modeled illuminator and mask conditions for 193 nm dry lithography were: 0.78 NA, 0.3 conventional sigma, alternating phase shift mask.

For each single layer BARC film thickness or, in the case of the dual layer BARC combination of film thicknesses, and photoresist film thicknesses were varied from 10 nm to 200 nm in steps of 2 nm. Photoresist CDs for each discrete photoresist thickness were evaluated at the approximate Esize dose for each $k_1$ value, where $k_1$=(resolution)×(numerical aperture)/(wavelength of exposure radiation).

The CD swing amplitude for each combination of BARC film thickness and $k_1$ was approximated by evaluation of the fitted parameters derived from least-squares regression analysis. The trigonometric mathematical model used was a form of the physical equation for simple harmonic motion with 5 adjustable parameters, and by analyzing the fitted amplitude parameter the CD swing amplitude can be evaluated. CD swing data sets with fit R-square values of less than 0.8 were filtered from the data set. FIG. 2 shows simulated discrete 100 nm 1.1 CDs vs. photoresist film thickness, and the plot of the fitted continuous equation. Model fit R-square for the data in FIG. 2 is 0.997. The associated fitted amplitude parameter equals the total vertical displacement (min to max) and in this case is 56.5 nm. It readily follows that modeled percent CD swing for the 100 nm 1:1 line is 56.5%.

FIG. 3 shows the percent CD swing versus BARC thickness for the $1^{st}$ and $2^{nd}$ min single layer BARCs. The % CD swing increases, showing a worsening of process latitude, as the $k_1$ value decreases for a fixed BARC thickness. The $2^{nd}$ min BARC is incapable of suppressing CD swing below 10% for $k_1$<0.3 BARC film thickness latitude is also proportinonal to $k_1$ for both BARCS.

FIG. 4 shows the same plot with the addition of the compound Dual layer BARC stack. The dual layer BARC film thickness is the combined film thickness of both upper and lower layers. The % CD swing amplitude may be suppressed well below 5% in the plots for $k_1$ as low as 0.28. However, for single layer BARC all the minimum of the curves for different $k_1$ values cannot be below 5%. The dual layer BARC also shows a greater range of film thickness tolerance for any $k_1$ compared to the single layer BARCs evaluated, and all the curves have a minimum below 5%. The suppression of CD swing amplitude at smaller $k_1$ is an advantage for the dual layer BARC systems.

Additionally, the larger range of dual layer BARC film thickness tolerance suggests better planarization properties, an important consideration with regard, at least, to usable resist depth-of-focus.

Example 2

Synthesis of Polymer for Lower Layer Antireflective Coating (LDL1)

83.2 g of benzyl methacrylate, 25.8 g of hydroxyethyl methacrylate, 500 ml tetrahydrofuran (THF) and 2 g 2,2 azobisisobutyronitrile (AIBN) were combined, in that order, to a 1 L round bottom flask. The solution was refluxed for 12 hr under nitrogen. After cooling, the polymer was recovered by precipitation into 4 L of hexane, filtered and dried in a vacuum desiccator. The polymer was produced with a 98.5% yield. The reaction scheme for this procedure is shown below. The molecular weight of the HB polymer as measured using GPC with a polystyrene standard was 30,000. The NMR for the polymer was measured using 300 MHZ, H1-spectrum in acetone-d6, and the results were S, br, 7.35 ppm, 5H, phenyl protons; S, br, 7.35 ppm, 2H, $CH_2$-phenyl; M, br, 3.6 to4.2 ppm, 1H O—$CH_2$—$CH_2$.

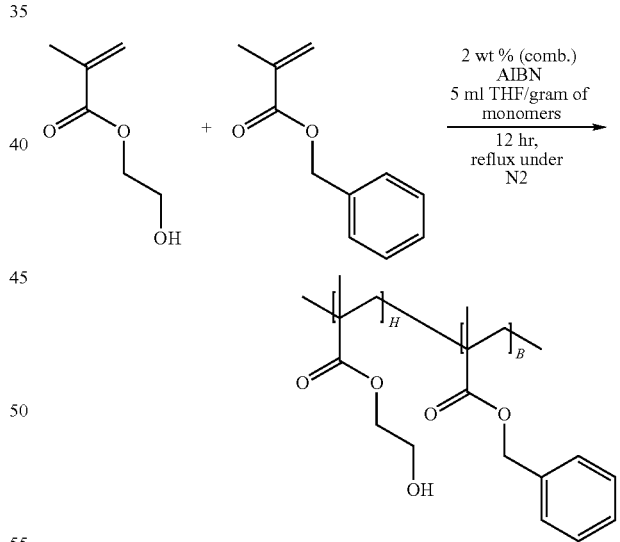

HB  HEMA/Bz = 20/80 feed weight ratio

Example 3

Formulation of Lower Layer Antireflective Coating

The formulation consisted of 9.21 g of HB copolymer (Example 2), 2.76 g MX-270 (available from Sanwa Chemical Co Ltd. 6520, Tamura, Hiratuka-city, Kanagawa, Japan), 2 g dodecylbenzylsulfonium triethylammonium salt, 2 g of p-toluenesulfonic acid triethylammonium salt, and 460 g 70/30 PGMEA/PGME.

Example 4

Formulation of Upper layer (UDL1) of a Two Layer BARC

The formulation consisted of 6.2 g EHMA (available from DuPont Electronic Technologies, P.O. Box JJ, Ingleside, Tex.), 3.01 g EHMV2 (Dupont ET.), 1.86 g dodecylbenzylsulfonium triethylammonium salt, 1.86 g of p-toluenesulfonic acid triethylammonium salt, triphenylsulfonium nonaflate and 460 g 70/30 PGMEA/PGME. The formulation for this procedure is shown below.

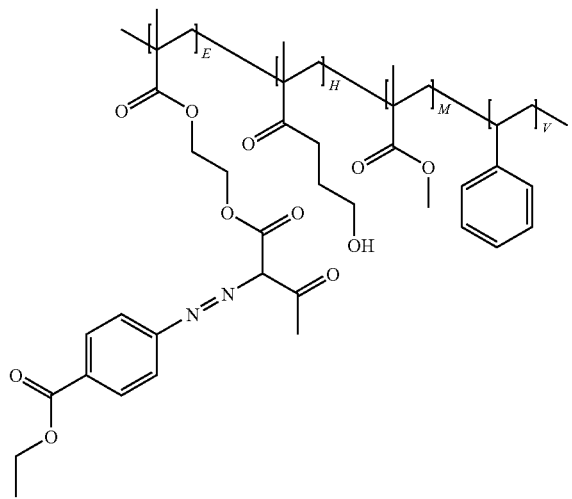

EHM1   E/H/M/V = 10/25/65/0 feed mole ratio

EHMV2   E/H/M/V = 10/27.8/27.8/34.4 feed mole ratio

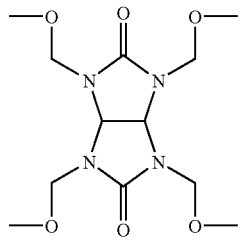

MX-270

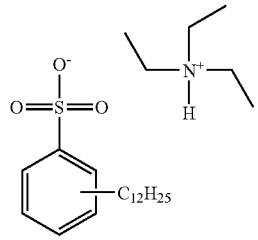

DBSA/Eth3N

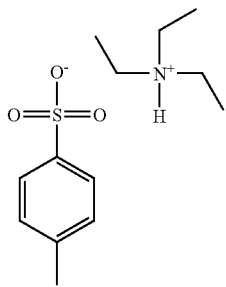

PTSA/Eth3N

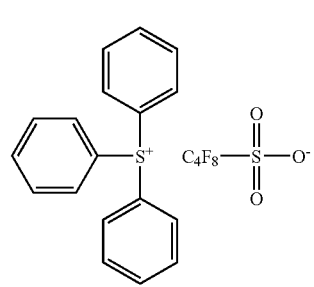

TPSNF

Example 5

Imaging of Photoresist Under Immersion Conditions

A two layer bottom antireflective coating stack was applied to a silicon wafer by spin coating at 2000 rpm a lower layer (LDL1, Examples 3) and baking at 200° C. for 60 seconds followed by spin-coating at 2000 rpm an upper layer (UDL1, Example 4) and baking at 200° C. for 60 seconds. The optical indices and film thicknesses are recorded in Table 1. Optical constants, n and k, and film thicknesses were measured on a J. A. Woollam® VUV VASE® Spectroscopic Ellipsometer.

TABLE 1

Optical Constants at 193 nm for Dual Layer BARC at the optimum film thickness for silicon substrates

|  | n | k | FT (nm) |
|---|---|---|---|
| Upper BARC layer (UDL1) | 1.7 | 0.20 | 45 |
| Lower BARC layer (LDL1) | 1.9 | 0.67 | 32 |

Using AZ® EXP IRC1000, (available from AZ Electronic Materials, Somerville, N.J.) different photoresist films thicknesses were spin coated onto the two layer ARC coated wafers from Example 5, and the wafers were baked at 130° C. for 60 seconds. The resultant films were exposed on a Exitech 193 nm immersion stepper located at Rochester Institute of technology; NA=1.07; illumination, quadrapole center sigma=0.812; sr=0.15, binary reticle; field step 2 mm×2 mm. Wafers were then post-exposure baked (PEB) at 115° C. for 90 s. The films were developed in 0.26N tetramethyammonium hydroxide aqueous solution for 30 seconds. The exposure dose at 0.0 focus was 52 mJ/cm². The imaged photoresist features were analyzed using SEM. Line and space photoresist features were observed for 80 nm L/S up to 150 nm L/S on all wafers and were of good lithographic quality with no standing waves.

Example 6

A two layer antireflective coating stack and photoresist were coated as in Example 5. The resultant films were exposed on an Amphibian 193 nm immersion interferometer stepper located at Rochester Institute of technology; NA was 1.05. The wafers were then post-exposure baked (PEB) at 115° C. for 90 s. The films were developed in 0.26N TMAH aqueous solution for 30 seconds. Features were viewed using JEOL JWS-7550 electron micrographs. The 65 nm line/space pattern was of good lithographic quality.

Example 7

Imaging of Photoresist With Conventional Dry Conditions

A DL-BARC and photoresist were coated as in Example 5. The resultant films were exposed on a Nikon 306D 193 nm scanner; NA was 0.78; illumination, ⅔ annular, 6% attenuated phase shift reticle. Wafers were then post-exposure baked (PEB) at 115° C. for 90 s. The films were developed in 0.26N TMAH aqueous solution for 30 seconds. Coating, bake and development were done on a TEL® ACT 12 track which was linked to the Nikon tool. Top Down SEM pictures were obtained with a KLA8100 CD-SEM. The 95 nm line/space patterns with an exposure dose of 30 mJ/cm² showed no standing waves and the images were of good lithographic quality.

Example 8

An organo-silicon polymer of the type disclosed in WO 2004/113417 available from Dow Corning Corporation, 2200, West Salzburg Road, Midland, Mich. which had high absorption at 193 nm wavelength (n of 1.82 and k of 0.67 at 193 nm) was used as an lower-layer BARC material of the dual layer scheme. The solid content of this solution was adjusted with PGMEA so that 88 nm film thickness was achieved by spin-coating. This diluted solution, was spin-coated on bare silicon and the coated wafer was hard-baked at 250° C. for 90 seconds to cure the material. Then an additional organic antireflective coating material UDL1 from Example 4, (n of 1.7 and k of 0.2 values at 193 nm), was applied on the top of the cured lower film as an upper-layer BARC of dual-layer BARC scheme. A second hard bake, 200® C./60 s was applied to cause a cross-linking of the spin-coated film of upper organic BARC. The spin speed was adjusted so that 45 nm of the film thickness of the upper-layer BARC material was obtained.

A positive working 193 nm resist formulation, AZ® EXP IRC1500 (available from AZ Electronic Materials, Somerville, N.J.), was spin-coated on top of the wafer coated with the dual layer antireflective coatings and baked at 130° C./60 s to give a film thickness of 190 nm. The photoresist was then exposed by a Nikon 306D scanner (numerical aperture of 0.85 and dipole-illumination). After exposure, the wafer was subjected to a post-exposure bake step at 110° C. for 60 sec. The imaged photoresist was then developed with a 2.38 weight % aqueous solution of tetramethyl ammonium hydroxide for 30 sec. The line and space patterns were then observed by a scanning electron microscope. The photoresist showed an excellent resolution of 80 nm (1:1) free from scum and resist residue.

Example 9

A photoresist was coated on top of an antireflective coating which was on top of silicon oxide layer which in turn was on top of a silicon nitride layer, all of which are on a silicon substrate. The silicon oxide had a thickness tolerance of +/−75 nm and was transparent at the actinic wavelength of 193 nm. Using a calibrated photoresist model for AZ® T8328 photoresist (available from AZ Electronic Materials, Somerville, N.J.), the CD swing curves for 100 nm dense contact holes were simulated for two antireflective coating cases. CD swing curve is the variation of the critical dimensions of a photoresist pattern as a parameter is changed, such as the photoresist film thickness or the oxide thickness. An optimized single layer antireflective coating, 60 nm thick AZ® ArF-11 (available from AZ Electronic Materials, Somerville, N.J.), with n=1.75, k=0.57, and for a dual layer antireflective coating, 35 nm thick UDB1, n=1.70, k=0.20 over 52 nm LDB1, n=1.91, k=0.67 assuming a 6% attenuated contact hole mask with a 30 nm mask bias, 0.78NA and 0.80 sigma conventional illumination. Both antireflective coating options suppressed the CD swing curve due to oxide thickness variations to less than about 2 nm. However the CD swing curve due to photoresist thickness variations was very different for the two cases. In the case of the single layer antireflective coating the CD swing from changes in photoresist thickness was 27 nm, much more than desired. In the case of the dual layer antireflective coating, the CD swing from changes in photoresist thickness was 5 nm, a very desirable result. This result was achieved with a dual layer antireflective coating system whose n and k values were optimized for use on silicon. Better reflectivity control could have been obtained on oxide with a dual layer antireflective coating that has somewhat higher k values, for example 0.3 and 0.9 for the upper and lower antireflective coating layers, respectively.

The invention claimed is:

1. A process for imaging a photoresist comprising the steps of,
   a) forming a stack of multiple layers of organic antireflective coatings on a substrate comprising coating the layers, and curing and insolubilizing each of the layers of the multiple layers by heating, where each of the organic antireflective coatings independently comprises a polymer comprising an absorbing chromophore;
   b) forming a coating of a photoresist over an upper layer of the stack of multiple layers of organic antireflective coatings;
   c) imagewise exposing the photoresist with an exposure equipment; and,
   d) developing the coating with a developer;
   wherein a refractive index of the upper layer of the multiple layers of organic antireflective coatings has a refractive index which is equal to or greater than a refractive index of the photoresist layer and where the refractive indices of the upper layer and the photoresist range from about 1.65 to about 1.75.

2. The process according to claim 1, where the exposure equipment comprises a lens with numerical aperture of greater than one.

3. The process according to claim 1 where the exposure equipment uses immersion lithography.

4. The process according to claim 1, where the stack of multiple layers of antireflective coatings comprises two layers, a lower layer and an upper layer.

5. The process according to claim 4 where the lower layer absorbs more radiation than the upper layer.

6. A process according to claim 4, where the lower layer has an absorption k value greater than 0.3.

7. The process according to claim 4 where the lower layer has an absorption k value less than 1.2.

8. The process of claim 1 where the layers in the stack of coatings have different absorption of exposure radiation.

9. The process according to claim 1 where in the multiple stack, a lower layer absorbs more radiation than the upper layer.

10. The process according to claim 1 where the upper layer of the stack of multiple layers of antireflective coatings has an absorption k value greater than 0.05.

11. The process according to claim 1 where the upper layer has an absorption k value less than 0.4.

12. The process according to claim 1, where the stack of multiple layers of antireflective coating reflect less than 2% of the radiation.

13. The process according to claim 1, where the stack of multiple layers of antireflective coating reflect less than 1% of the radiation.

14. The process according to claim 1, where the antireflective coatings comprise a curable polymer.

15. The process according to claim 1, where the antireflective coating further comprises a crosslinking agent, and an acid generator.

16. The process according to claim 15 where the acid generator is a thermal or photoacid generator.

17. The process according to claim 1 where radiation for imagewise exposure is less than 300 nm.

18. The process according to claim 1 where radiation for imagewise exposure is selected from a group consisting of 248 nm, 193 nm and 157 nm.

19. The process according to claim 1, where the developer is an aqueous alkaline solution.

20. The process according to claim 19, where the developing solution comprises tetramethylammonium hydroxide.

21. The process according to claim 1, where the refractive indices are at 193 nm and 157 nm.

22. The process according to claim 1, where the photoresist has a k value less than 0.05.

* * * * *